United States Patent
Lee

(10) Patent No.: US 11,424,328 B2
(45) Date of Patent: *Aug. 23, 2022

(54) GAN/DIAMOND WAFERS

(71) Applicant: RFHIC Corporation, Anyang-si (KR)

(72) Inventor: Won Sang Lee, Chapel Hill, NC (US)

(73) Assignee: RFHIC Corporation, Anyang-si (KR)

( * ) Notice: Subject to any disclaimer, the term of this patent is extended or adjusted under 35 U.S.C. 154(b) by 108 days.

This patent is subject to a terminal disclaimer.

(21) Appl. No.: 16/914,477

(22) Filed: Jun. 29, 2020

(65) Prior Publication Data

US 2021/0249258 A1 Aug. 12, 2021

Related U.S. Application Data

(60) Provisional application No. 62/971,869, filed on Feb. 7, 2020.

(51) Int. Cl.
*H01L 21/02* (2006.01)
*H01L 29/20* (2006.01)
(Continued)

(52) U.S. Cl.
CPC ...... *H01L 29/2003* (2013.01); *H01L 21/0254* (2013.01); *H01L 21/02378* (2013.01);
(Continued)

(58) Field of Classification Search
None
See application file for complete search history.

(56) References Cited

U.S. PATENT DOCUMENTS 6,951,556 B2  10/2005  Epstein
7,749,863 B1   7/2010  Micovic
(Continued)

FOREIGN PATENT DOCUMENTS

CN       1996556 A   7/2007
JP    2013-125971 A   6/2013
(Continued)

OTHER PUBLICATIONS

Office Action dated Dec. 17, 2021 in Taiwan Patent Application No. 110120356 with machine translation, 9 pages.
(Continued)

*Primary Examiner* — Jack S Chen
(74) *Attorney, Agent, or Firm* — Kim & Stewart LLP

(57) ABSTRACT

A method for fabricating a semiconductor wafer is provided, where the semiconductor wafer includes a diamond layer and a semiconductor layer having III-Nitride compounds. The method includes the steps of: disposing a nucleation layer on a SiC substrate and disposing at least one semiconductor layer on the nucleation layer, the at least one semiconductor layer including a III-Nitride compound. The method further includes the steps of: disposing a protection layer on the at least one semiconductor layer; bonding a carrier wafer to the protection layer, the carrier wafer including a SiC substrate; removing the substrate, the nucleation layer and a portion of the at least one semiconductor layer; disposing a diamond layer on the at least one semiconductor layer; depositing a substrate wafer on the diamond layer; and removing the carrier wafer and the protection layer.

15 Claims, 9 Drawing Sheets

(51) Int. Cl.
*H01L 21/768* (2006.01)
*H01L 29/205* (2006.01)
*H01L 29/267* (2006.01)
*H01L 29/66* (2006.01)
*H01L 29/16* (2006.01)
*H01L 23/00* (2006.01)

(52) U.S. Cl.
CPC .. *H01L 21/02488* (2013.01); *H01L 21/02527* (2013.01); *H01L 21/76871* (2013.01); *H01L 21/76897* (2013.01); *H01L 24/94* (2013.01); *H01L 29/1602* (2013.01); *H01L 29/205* (2013.01); *H01L 29/267* (2013.01); *H01L 29/66462* (2013.01)

(56) References Cited

U.S. PATENT DOCUMENTS

| | | | |
|---|---|---|---|
| 7,884,373 | B2 | 2/2011 | Korenstein et al. |
| 8,674,405 | B1 | 3/2014 | Babic et al. |
| 8,940,620 | B2 | 1/2015 | Koudymov et al. |
| 9,711,534 | B2 | 7/2017 | Liang et al. |
| 10,043,700 | B2 | 8/2018 | Francis |
| 10,128,107 | B1 | 11/2018 | Cho et al. |
| 2002/0173120 | A1 | 11/2002 | Enquist |
| 2004/0029359 | A1 | 2/2004 | Letertre et al. |
| 2005/0164482 | A1 | 7/2005 | Saxler |
| 2006/0266280 | A1 | 11/2006 | Francis et al. |
| 2008/0142813 | A1 | 6/2008 | Chang et al. |
| 2008/0206569 | A1 | 8/2008 | Whitehead et al. |
| 2009/0078943 | A1 | 3/2009 | Ishida et al. |
| 2009/0133811 | A1 | 5/2009 | Moriceau et al. |
| 2010/0012947 | A1 | 1/2010 | Faure |
| 2010/0155900 | A1 | 6/2010 | Korenstein et al. |
| 2011/0186959 | A1 | 8/2011 | Jerome et al. |
| 2012/0168773 | A1 | 7/2012 | Sung |
| 2013/0157440 | A1 | 6/2013 | Koudymov et al. |
| 2013/0292691 | A1 | 11/2013 | Henley et al. |
| 2014/0038392 | A1 | 2/2014 | Yonehara et al. |
| 2015/0255591 | A1 | 9/2015 | Sadaka |
| 2016/0308010 | A1 | 10/2016 | Viswanathan et al. |
| 2017/0372965 | A1 | 12/2017 | Nishibayashi et al. |
| 2018/0366558 | A1 | 12/2018 | Kaplun et al. |
| 2019/0326162 | A1 | 10/2019 | Kaplun et al. |
| 2021/0249511 | A1* | 8/2021 | Lee .............. H01L 21/02488 |
| 2021/0249512 | A1* | 8/2021 | Lee .............. H01L 24/94 |

FOREIGN PATENT DOCUMENTS

| | | | |
|---|---|---|---|
| KR | 10-2011-0099720 | A | 9/2011 |
| KR | 10-2017-0137180 | A | 12/2017 |
| TW | 200826322 | A | 6/2008 |
| TW | 200905731 | A | 2/2009 |
| TW | 201324704 | A | 6/2013 |

OTHER PUBLICATIONS

Office Action dated Feb. 18, 2022 in Taiwan Patent Application No. 110120357 with machine translation, 7 pages.
Office Action dated Dec. 21, 2021 in Taiwan Patent Application No. 110120362 with machine translation, 4 pages.
Office Action dated Dec. 17, 2021 in Taiwan Patent Application No. 110120366 with machine translation, 10 pages.
Non-Final Office Action dated Mar. 3, 2022 in U.S. Appl. No. 16/905,870, 11 pages.
Non-Final Office Action dated Mar. 3, 2022 in U.S. Appl. No. 16/914,474, 11 pages.
Ejeckam, Felix et al. "GaN-on-Diamond: A Brief History," 2014 Lester Eastman Conference on High Performance Devices (LEC), pp. 1-5, available at https://ieeexplore.IEEE.org/stamp/stamp.jsp?tp=&arnumber=6951556 (Year: 2014).
Non-Final Office Action dated May 25, 2022 in U.S. Appl. No. 16/897,329, 43 pages.
Notice of Allowance dated Jun. 13, 2022 in U.S. Appl. No. 16/914,474, 13 pages.

* cited by examiner

GAN/DIAMOND WAFERS

CROSS-REFERENCE TO PRIOR APPLICATIONS

This application claims priority of a U.S. Patent Application No. 62/971,869, Feb. 7, 2020, which is hereby incorporated by reference in its entirety.

BACKGROUND

A. Technical Field

The present invention relates to semiconductor wafers, and more particularly, to wafers having a diamond layer and a semiconductor layer including III-nitride semiconductor material and methods for fabricating the wafers and devices.

B. Background of the Invention

Gallium Nitride (GaN) or AlGaN or AlN has electrical and physical properties that make it highly suitable for radio frequency (RF) devices, such as high electron mobile transistors (HEMTs). In general, an RF device produces a large amount of heat energy during operation, requiring a mechanism to extract the heat energy from the device to avoid device failure. Diamond is known to have a good thermal conductivity and can be used as material for a substrate on which the AlGaN/GaN layer is formed.

One conventional approach to form an AlGaN/GaN HEMT layer on a diamond layer is depositing AlGaN/GaN HEMT layer directly on a silicon substrate, removing the silicon substrate and forming a diamond layer on the AlGaN/GaN HEMT layer. This approach is attractive for its low manufacturing cost. However, the conventional technique is not suitable for manufacturing AlGaN/GaN HEMT in a consistent manner. First, the thickness of the wafers is much less than 200 µm, where a typical semiconductor processing equipment has robot arms for carrying semiconductor wafers and the robot arms require that the thickness of each wafer be at least 500 µm. Second, as the conventional wafers are too thin, the wafers may not have sufficient mechanical strength to withstand the thermal and mechanical stresses during the subsequent processes for forming semiconductor devices in wafers. Thus, there is a need for a new technique for providing mechanical strength for the wafers and to meet the requirement for the robot arms used in the semiconductor processing.

SUMMARY OF THE DISCLOSURE

According to one aspect of the present invention, a method for fabricating a semiconductor wafer includes: disposing a nucleation layer on a substrate; disposing at least one semiconductor layer on the nucleation layer, the at least one semiconductor layer including a III-Nitride compound; disposing a protection layer on the at least one semiconductor layer; bonding a carrier wafer to the protection layer, the carrier wafer including a SiC substrate; removing the substrate, the nucleation layer and a portion of the at least one semiconductor layer; disposing a diamond layer on the at least one semiconductor layer; depositing a substrate wafer on the diamond layer; and removing the carrier wafer and the protection layer.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, a device, or a method on a tangible computer-readable medium.

One skilled in the art shall recognize: (1) that certain steps may optionally be performed; (2) that steps may not be limited to the specific order set forth herein; and (3) that certain steps may be performed in different orders, including being done contemporaneously.

Elements/components shown in diagrams are illustrative of exemplary embodiments of the disclosure and are meant to avoid obscuring the disclosure. Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims. Furthermore, the use of certain terms in various places in the specification is for illustration and should not be construed as limiting.

Figure 1:
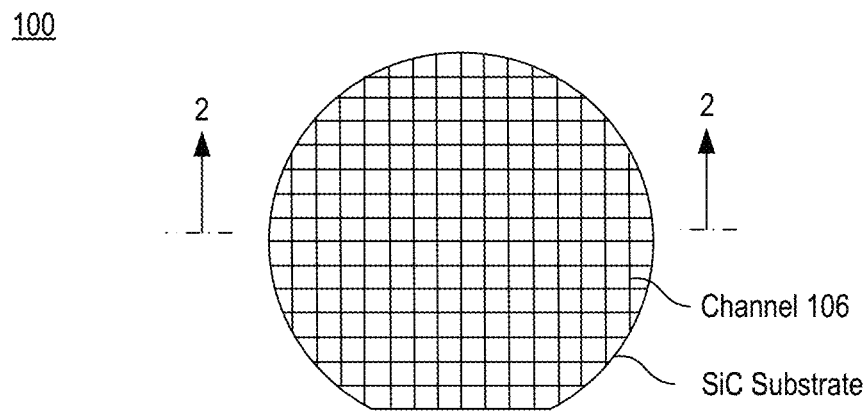
FIGS. 1-3 show an exemplary process for fabricating a carrier wafer that includes a SiC substrate according to embodiments of the present disclosure.
Figure 2:
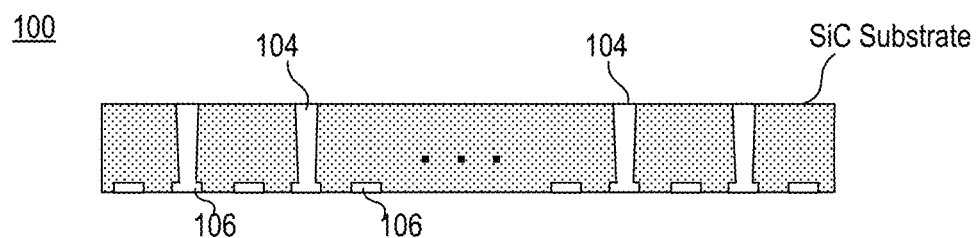
Figure 3:
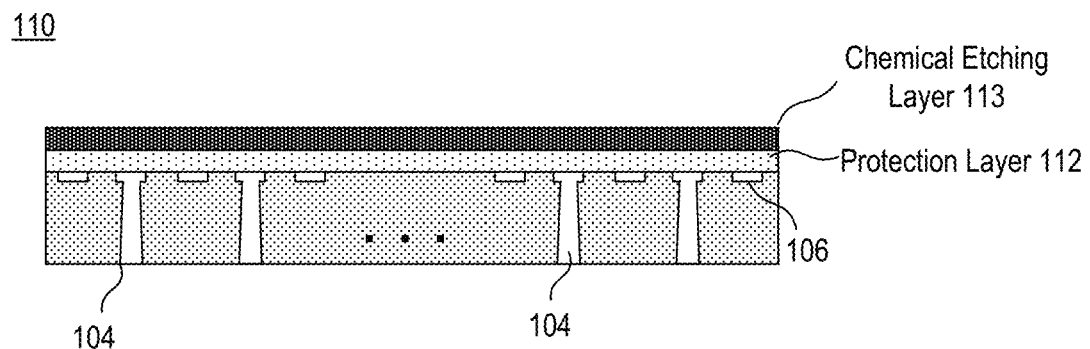

FIGS. 1-3 show an exemplary process for fabricating a carrier wafer 110 that includes a SiC substrate 100 according to embodiments of the present disclosure. FIG. 1 shows a top view of a SiC substrate 100 according to embodiments of the present disclosure. FIG. 2 is a cross sectional view of the SiC substrate 100, taken along the line 2-2, according to embodiments of the present disclosure. As depicted, the SiC wafer 100 may include one or more thru-holes 104 and one or more channels/grooves 106 in a grid pattern, where the channels 106 may be in fluid communication with the thru-holes 104. As discussed below, the SiC substrate 100 may be separated from a protection layer 112 and a chemical etching layer 113 by injecting liquid, such as Tetramethyl-ammonium hydroxide (TMAH) solution and piranha solution ($H_2SO_4+H_2O_2+H_2O$), into the channels 106 through the thru-holes 104. It is noted that the channels 106 may be in other suitable pattern to control the area where the liquid reacts with the protection layer 112. In embodiments, the laser drilling process, or any other suitable techniques, may be used to form the thru-holes and channels in the SiC substrate 100.

As depicted in FIG. 3, the protection layer 112 and chemical etching layer 113 may be deposited on the SiC substrate 100. In embodiments, the protection layer 112 may be formed of material that includes one or more of SiN, poly-silicon, $Al_2O_3$ and GaN, and may be deposited by a suitable deposition technique. In embodiments, the chemical etching layer 113 may be formed of AlN and may be deposited by a suitable deposition technique.

Figure 4:
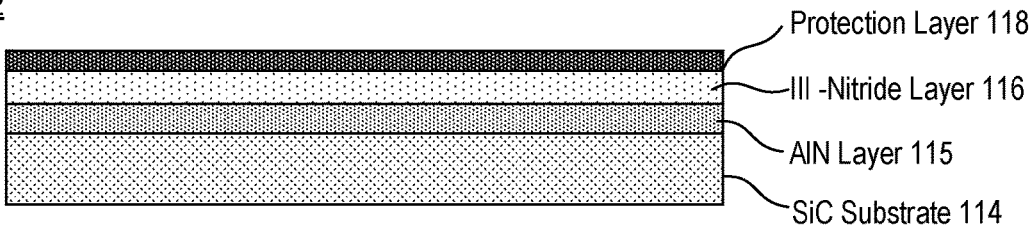
FIGS. 4-16 show an exemplary process for fabricating a wafer that includes two diamond layers and a III-Nitride layer according to embodiments of the present disclosure.

FIGS. 4-16 show an exemplary process for forming a wafer that includes a diamond layer and a III-Nitride layer (or, equivalently semiconductor layer that includes III-Nitride compound) according to embodiments of the present disclosure. As depicted in FIG. 4, the wafer 112 may include a SiC substrate 114, an AlN layer 115, a III-Nitride layer 166, and a protection layer 118.

Figure 5A:
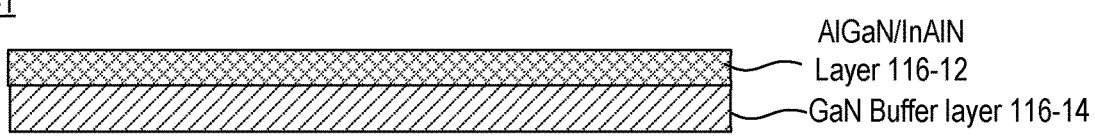
Figure 5B:
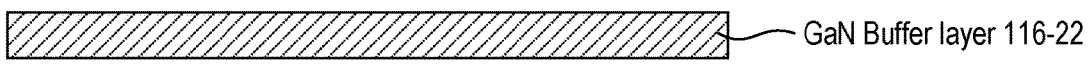

In embodiments, the III-Nitride layer 116 may include one or more layers that each include a GaN compound, such as hexagonal AlGaN/GaN, InAlN/GaN or cubic AlGaN/GaN. In the following sections, a III-Nitride layer may collectively refer to one or more layers that each includes a III-Nitride compound. FIG. 5A shows an exemplary III-Nitride layer 116-1 that includes: a GaN buffer layer 116-14; and at least one of AlGaN layer and InAlN layer 116-12. (Hereinafter, the notation AlGaN/InAlN layer refers to one or more layers that each is formed of a material that includes at least one of AlGaN and InAlN.) FIG. 5B shows another exemplary III-Nitride layer 116-2 that includes only one GaN buffer layer 116-22.

In embodiments, the protection layer 118 may protect the III-Nitride layer 116 from thermal and mechanical damages that may occur during the subsequent processes. For instance, if the glass coating 126 (in FIG. 6) is directly attached to the III-Nitride layer 116, the mismatch of coefficients of thermal expansion (CTE) between the glass coating 126 and the III-Nitride layer 116 may generate stress on the III-Nitride layer 116, generating negative impact on the performance of semiconductor devices to be formed in the III-Nitride layer 116. In embodiments, the material and thickness of the protection layer 118 may be selected to mitigate the stress due to the mismatch of CTEs. In embodiments, the protection layer 118, which may be formed of a material that includes one or more of SiN, poly silicon, $Al_2O_3$, AlN and GaN, may be deposited by a suitable deposition technique.

In general, the large lattice mismatch between the silicon of the SiC substrate 114 and the GaN of the III-Nitride layer 116 may lead to cracks in the GaN buffer when cooling the heterostructure from the growth temperature to the room temperature. In embodiments, the AlN layer (or equivalently, nucleation layer) 115 may be formed on the SiC substrate 114 to prevent cracks in the GaN buffer layer 116-14 (or 106-22) and/or growth of the cracks to the AlGaN/InAlN layer 116-12. In embodiments, the AlN layer 115 and the III-Nitride layer 116 may be formed on the SiC substrate 114 by conventional wafer processing techniques, such as metal-organic chemical vapor deposition (MOCVD) technique.

Figure 6:
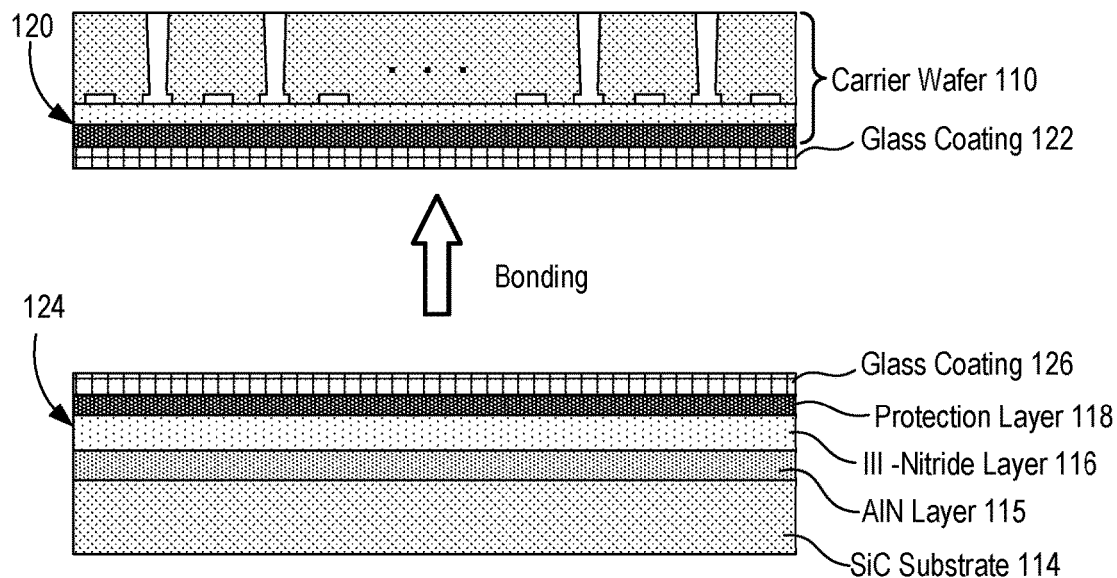
Figure 7:
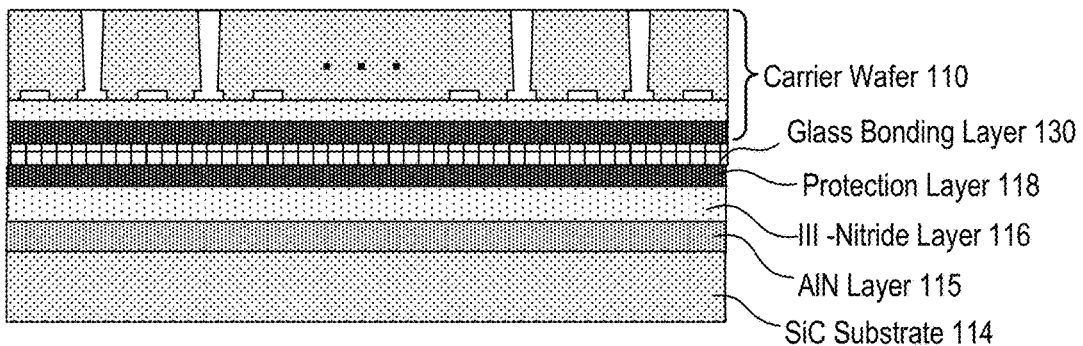

FIG. 6 shows a process of bonding the wafer 120 to the wafer 124 according to embodiments of the present disclosure. As depicted, the wafer 120 may include the carrier wafer 110 and a glass coating 122 formed on the chemical etching layer 113. In embodiments, the wafer 124 may be prepared by forming a glass coating 126 on the protection layer 118. Then, the wafer 120 may be mounted on the wafer 124 and heated at the temperature of 900-1000° C. to melt the glass coatings 122 and 126 and to form a glass bonding layer. FIG. 7 shows a wafer 128 that may include the carrier wafer 110 bonded to the wafer 124 by the glass bonding process, where the bonding layer 130 may be formed by melting the glass coatings 122 and 126.

Figure 8:
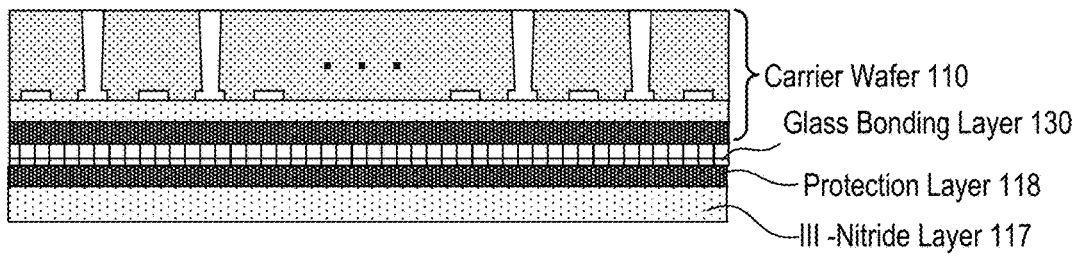

In embodiments, as depicted in FIG. 8, the SiC substrate 114, AlN (nucleation) layer 115 and a portion of the III-Nitride layer 116 may be removed to form the wafer 128. In embodiments, the SiC substrate 114 may be removed by at least one of lapping and dry etching processes, even though other suitable process may be used to remove the SiC substrate 114. In embodiments, the nucleation layer 115 may be removed by a wet etching process, even though other suitable process may be used to remove the nucleation layer 115.

In embodiments, as discussed above in conjunction with FIG. 5A, the III-Nitride layer 116 may include the AlGaN/InAlN layer 116-12 and GaN layer 116-14. In alternative embodiment, as discussed above in conjunction with FIG. 5B, the III-Nitride layer 116 may include only GaN layer 116-22. In both cases, each of the GaN layers may include a portion near the interface between the GaN layer and nucleation layer 115, where the portion includes cracks developed during deposition of the GaN layer 116-22, 116-14) and/or AlGaN/InAlN layer 116-12. As such, the portion of the GaN layer having the cracks may be removed so that the remaining GaN layer may not include any crack. In the wafer 132, the III-Nitride layer 117 refers to a III-Nitride layer that is formed by removing the portion of the GaN layer from the III-nitride layer 116.

Figure 9:
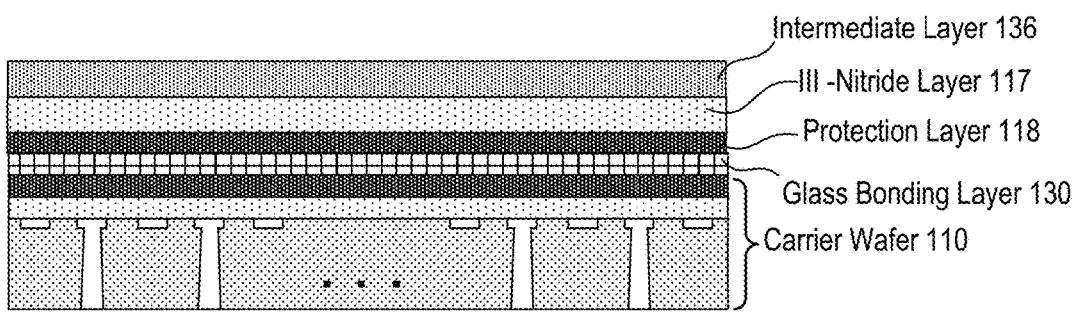

As depicted in FIG. 9, an intermediate layer 136 may be formed on the III-Nitride layer 117, where the intermediate layer 136 may include a first intermediate layer and a second intermediate layer (or which is al referred to as seed layer). If a diamond layer is directly deposited on the III-Nitride layer 117, the mismatch of coefficients of thermal expansion (CTE) between the diamond layer and the III-Nitride layer 117 may generate thermal stress on the III-Nitride layer 117 during formation of the diamond layer, and as such, the first intermediate layer may be deposited to mitigate the thermal stress. In embodiments, the material and thickness of the first intermediate layer may be selected to mitigate the stress due to the mismatch of CTEs. In embodiments, the first intermediate layer may be formed of a dielectric material, such as poly-Si, $SiO_2$, $Al_2O_3$ or SiN.

In embodiments, the second intermediate layer (i.e., a seed layer) may be formed on the top surface of the first intermediate layer. To form the seed layer, the wafer 134 may be submerged in an aqueous suspension of diamond nano particle (diamond seed particles) so that the top surface of the first intermediate layer may be in direct contact with the aqueous suspension. The diamond particles may be adsorbed onto the surface of the first intermediate layer, to thereby form the seed layer. Depending on the exposure time in the suspension and the concentration of the diamond particles, the density of the particles in the seed layer may be determined. In embodiments, the diamond layer 140 (in FIG. 10) may adhere to the seed layer better than to the first intermediate layer.

Figure 10:
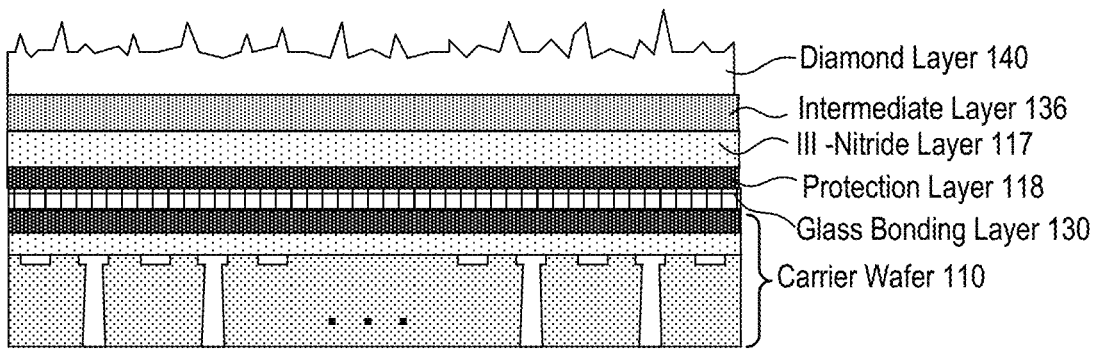
Figure 11:
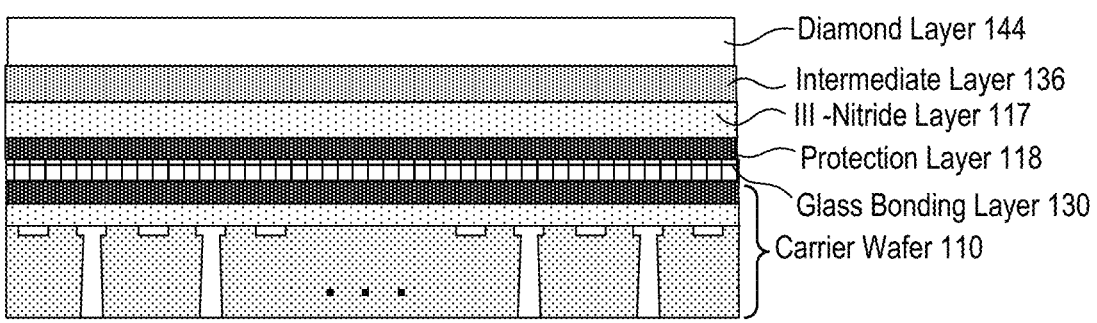

In embodiments, after forming the intermediate layer 136, the diamond layer 140 may be disposed on the intermediate layer 136, to thereby form the wafer 138 in FIG. 10. In embodiments, the diamond layer 140 may be formed by chemical vapor deposition (CVD) technique, even though other suitable techniques may be used. Then, a lapping process may be carried out to reduce the surface roughness of the diamond layer 140. In FIG. 11, the wafer 142 may include a diamond layer 144 that has a top surface with enhanced flatness by the lapping process.

Figure 12:
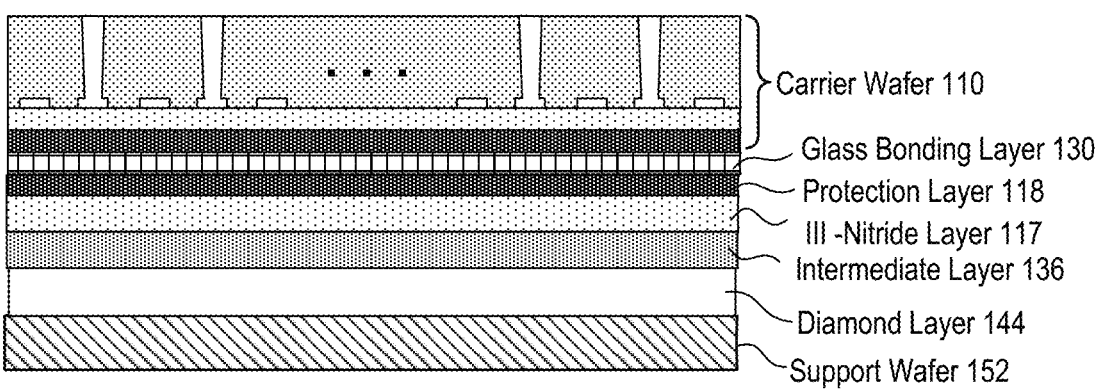

In embodiments, a support wafer 152 may be deposited on the diamond layer 144, as shown in FIG. 12. As depicted in FIG. 12, the support wafer 152 in the semiconductor wafer 150 may include one or more layers, as depicted in FIGS. 13A-13B.

Figure 13A:
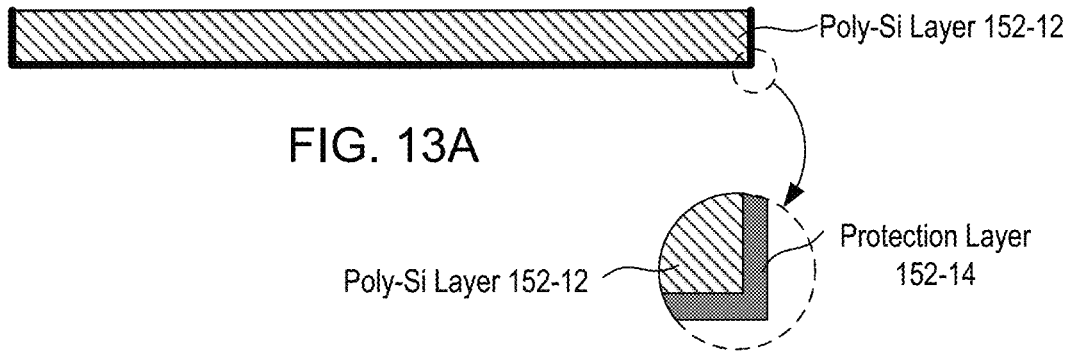

In FIG. 13A, the support wafer 152-1 may include: a poly-silicon layer 152-12 deposited on the diamond layer 144; and a protection layer 152-14 that may be deposited on the bottom and side surfaces of the poly silicon layer 152-12. In embodiments, the top surface of the poly-silicon layer 152-12 may be in direct contact with the diamond layer 144. In embodiments, the poly-silicon layer 152-12 may be deposited by a suitable technique, such as chemical vapor deposition (CVD) technique. As discussed below in conjunction with FIG. 15, the carrier wafer 110 may be removed from the wafer 150 using the Tetramethylammonium hydroxide (TMAH) solution and piranha solution. In embodiments, the protection layer 152-14 may protect the poly-silicon layer 152-12 from the TMAH solution and piranha solution during the removal process of the carrier wafer 110. In embodiments, the protection layer 152-14 may be formed of a material that includes one or more of Ti/Au, Cr/Au, SiN, $Al_2O_3$, and AlN, and may be deposited by a suitable deposition technique, such as sputtering or low pressure chemical vapor deposition (LPCVD) technique. In embodiments, the protection layer 152-14 may be formed of any material that does not react with the TMAH solution.

Figure 13B:

In FIG. 13B, the support wafer 152-2 may include a poly-GaN layer 152-22, where the poly-GaN layer 152-22 may be deposited on the diamond layer 144 by a suitable technique, such as Hydride vapor phase epitaxy (HYPE) technique. In the case where the poly-GaN substrate 152-2 is used as the substrate wafer 152 in FIG. 12, any protection layer may not be necessary since the TMAH solution does not react with poly-GaN.

Figure 14:
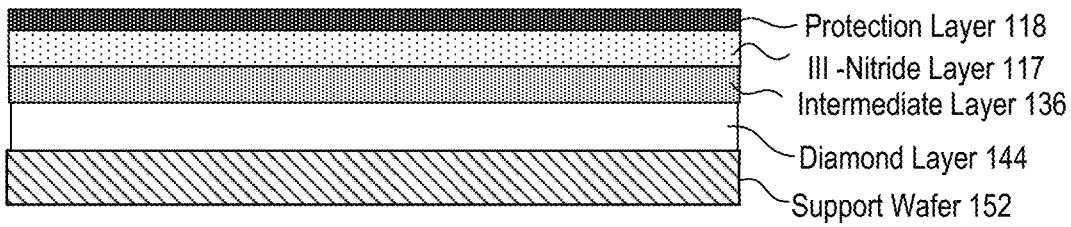

In embodiments, the carrier wafer 110 and glass bonding layer 130 may be removed from the wafer 150 to form the wafer 156 in FIG. 14. In embodiments, the carrier wafer 110 may be separated from the glass bonding layer 130 by the chemical lift-off technique. To remove the carrier wafer 110, the TMAH solution may be introduced into the channels/grooves 106 via the thru-holes 104, where the TMAH solution may selectively etch the protection layer 112 such that pattern of the channels 106 is transferred to the protection layer 112 and reaches the top surface of the chemical etching layer 113. Subsequently, the piranha solution may be introduced into the channels formed in the protection layer 112 through the thru-holes 104 so that the chemical etching layer 113 may be etched by the piranha solution. Upon etching the chemical etching layer 113, the remaining portion of the carrier wafer 110 may be separated from the glass bonding layer 130. In embodiments, the protections layers 112 and 118 may protect the III-Nitride layer 117 during wet etching processes.

In embodiments, upon removing the carrier wafer 110 and glass bonding layer 130 from the wafer 150, the wafer 156 in FIG. 14 may be formed. In embodiments, an edge trimming process may be optionally performed on the wafer 156 to make primary/flat zone in the wafer 156 before shipping to a foundry for further processing of the wafer 156.

Figure 15:
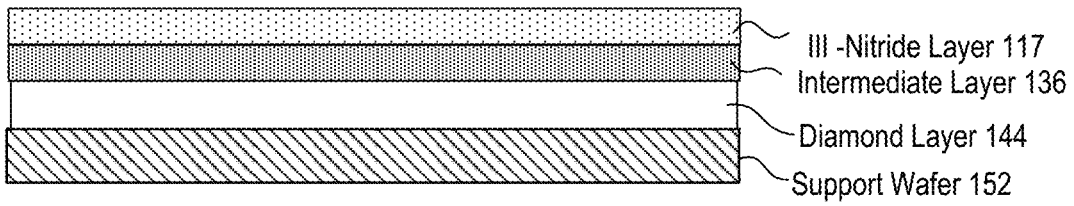

In embodiments, as shown in FIG. 15, the protection layer 118 may be removed from the wafer 156 by a suitable process(es).

Figure 16:
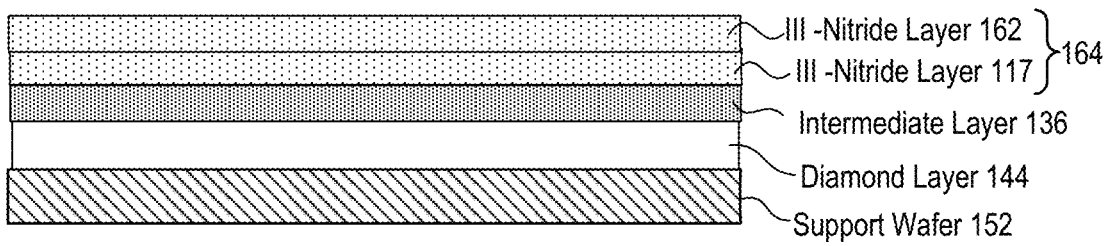

As discussed above in conjunction with FIG. 5B, the III-Nitride layer may have a GaN buffer layer only i.e., the III-Nitride layer 117 in the wafer 158 may include only GaN layer. In such a case, as shown in FIG. 16, another III-Nitride layer 162, such as AlGaN/InAlN layer, may be formed (regrown) on the GaN buffer layer, resulting in the III-Nitride layer stack 164. In the following sections, the III-Nitride layer stack 164 is referred to as a III-Nitride layer, even though more than one III-Nitride layer may be included in the III-Nitride layer 164.

Figure 17:
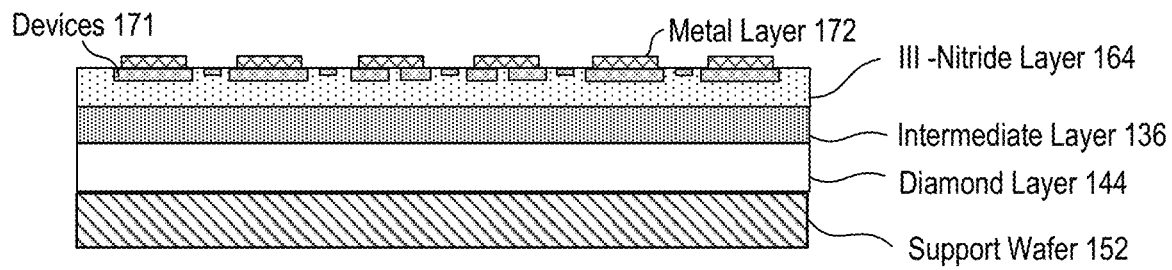
FIGS. 17-21 show an exemplary process for device processing the wafer in FIG. 13 to fabricate semiconductor devices according to embodiments of the present disclosure.

FIGS. 17-21 show an exemplary process for device processing the wafer 160 in FIG. 16 to fabricate semiconductor devices (such as HEMTs) according to embodiments of the present disclosure. In embodiments, as shown in FIG. 17, the wafer 170 may include various semiconductor devices 171, such as semiconductor transistors, formed in the III-Nitride layer 164. In embodiments, the semiconductor devices 171 may be formed by suitable semiconductor processes.

In embodiments, upon forming the semiconductor devices 171, a patterned metal layer 172 may be formed on the III-Nitride layer 164. In embodiments, the metal layer 172 may be formed of an ohmic alloy (preferably, but not limited to, Au, Ag, Ni, Ti, Al or any combination thereof) that alloys at 850° C. It is noted that various fabrication methods may be used to form the metal layer 172. In embodiments, the metal layer 172 may be annealed to reduce the contact resistance between the metal layer 172 and the III-Nitride layer 164. In embodiments, the metal layer 172 may be patterned by a suitable process, such as photolithography.

Figure 18:
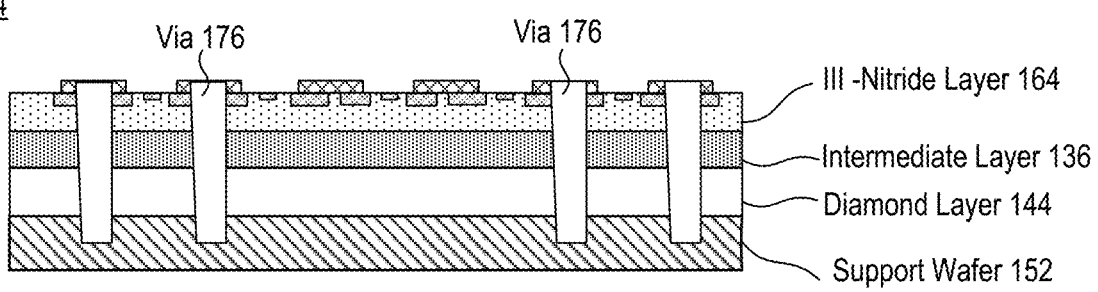

In embodiments, as shown in FIG. 18, the wafer 174 may include one or more vias 176 formed by a laser drilling technique or any other suitable technique. In the conventional techniques, vias are drilled from a support wafer side toward a III-Nitride side of the wafer 170. If the conventional techniques using laser beams are performed to drill vias from the support wafer 152 toward the III-Nitride layer 164, the diamond layer 144, which may be formed of poly crystalline diamond, may scatter the laser beam, causing unintended subsidiary drilled spots or damages to the area of metal-semiconductor interface, especially gate contact area.

In contrast, in embodiments, the one or more vias 176 may be drilled from the metal layer 172 toward the support wafer 152. This drilling technique of the present disclosure may reduce the scattering of the laser beam by the diamond layer 144. Also, the heat energy, which may be accumulated in the gate contact area during the drilling process of the metal layer 172 and the III-Nitride layer 164, may be discharged to the diamond layer 144 by heat transfer, which further reduces the thermal damages to the III-Nitride layer 164. In embodiments, the one or more vias 176 may extend from the metal layer 172 into the support wafer 152.

Figure 19:
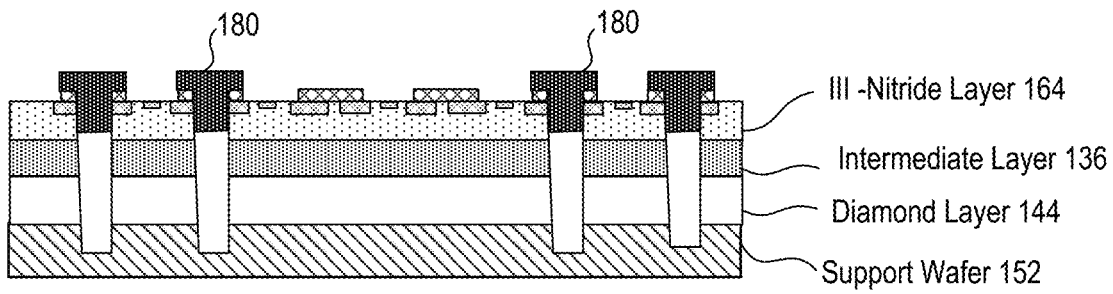
Figure 20:
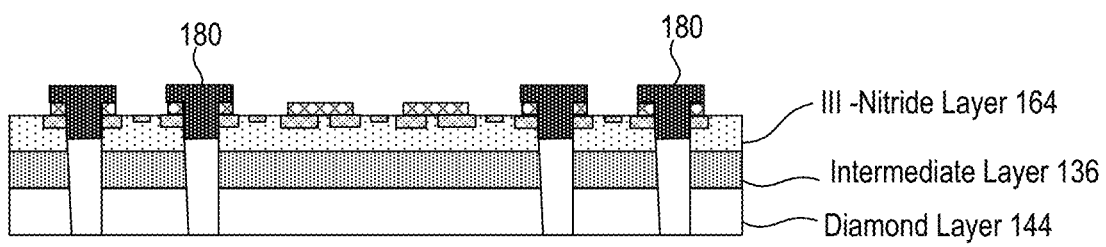

In embodiments, as shown in FIG. 19, a chemical or electrochemical gold plating technique may be used to deposit a thin layer of gold 180 on the metal layer 172 and in a top portion of the one or more vias 176. It is noted that other suitable metal may be used in place of the gold to form the metal layer 180 and other suitable techniques may be used to form the metal layer 180.

It is noted that the processes in FIGS. 17-19 are exemplary processes performed on the wafer 160. As such, it should be apparent to those of ordinary skill in the art that other suitable processes may be performed on the wafer 160 to form various semiconductor devices in the wafer 160.

As discussed above, in embodiments, the support wafer 152 may be deposited on the wafer 142 to bolster the mechanical strength of the wafer 142. As such, upon completion of the final passivation process (or any other process that may cause unintended mechanical deformation, such as bending and warping) of the wafer 178, the support wafer 152 may be removed from the wafer 178. In embodiments, the support wafer 152 may be removed from the wafer 178 by a lapping process and/or any other suitable processes, as shown FIG. 20. As described above, the support wafer 152 may be one of the support wafers 152-1 and 152-2. In embodiments, the support wafer 152-1 may include the poly-silicon layer 152-12 and the protection layer 152-14 that may cover the bottom and side surfaces of the poly-silicon layer 152-12. In alternative embodiments, the support wafer 152-2 may include the poly-GaN layer 152-22. In embodiments, upon removing the support wafer 152, the bottom surface of the diamond layer 144 may be further cleaned by a dry etching technique so as to remove remaining poly-silicon or poly-GaN material on the bottom surface of the diamond layer 144.

Figure 21:
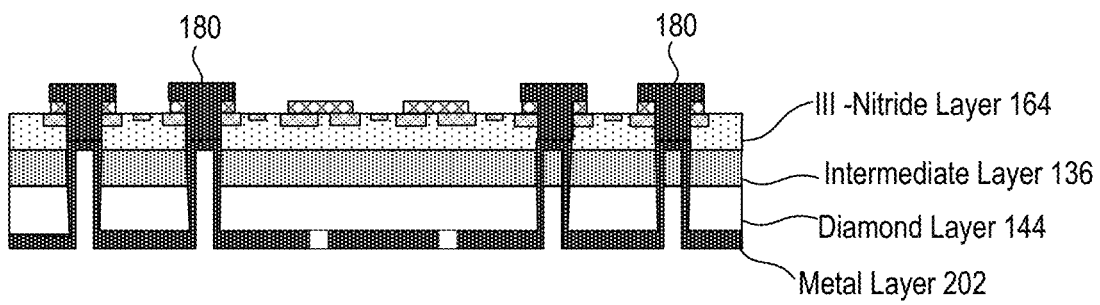

In FIG. 21, the wafer 200 may include a metal layer 202 that is deposited on the bottom surface of the diamond layer 144 and the side surfaces of the one or more vias 176 by the Au plating technique. It is noted that other suitable metal may be used in place of the gold for the metal layer 202, and other suitable techniques may be used to form the metal layer 202 on the diamond surface 144. In embodiments, the metal layer 202 may be in electrical contact with the metal layers 172 and 180 through the vias 176.

In embodiments, other processes, such as street etching, may be performed on the metal layer 202. Upon completion of the processes to form semiconductor devices in the wafer 200, the wafer 200 may be diced for singulation.

Figure 22:
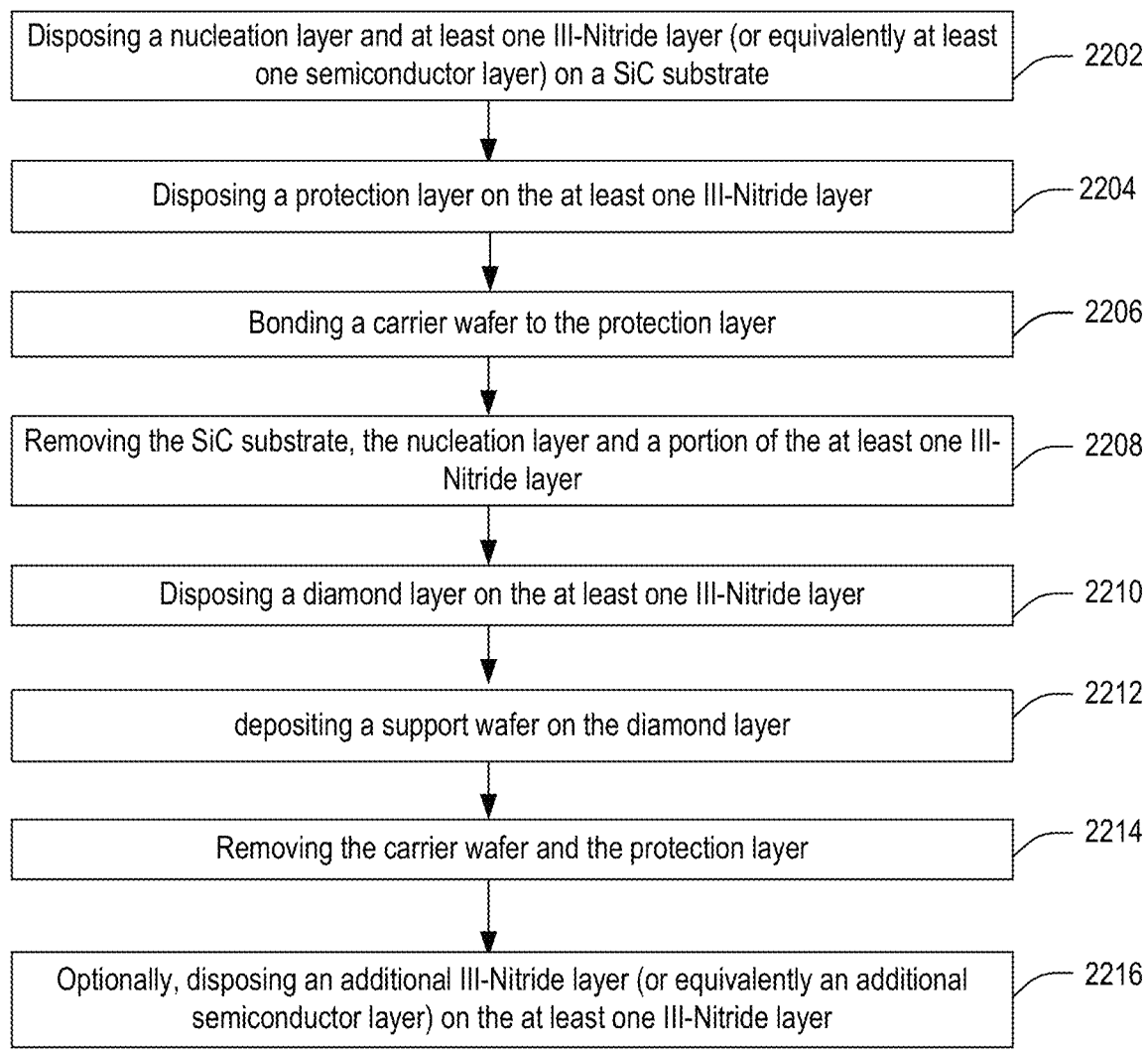
FIG. 22 shows a flowchart of an exemplary process for fabricating a semiconductor wafer according to embodiments of the present disclosure.

FIG. 22 shows a flowchart 2200 of an exemplary process for fabricating a semiconductor wafer according to embodiments of the present disclosure. At step 2202, the nucleation layer 115 and the III-Nitride layer (or equivalently, a semiconductor layer that includes a III-Nitride compound) 116 may be disposed on the SiC substrate 114. In embodiments, the nucleation layer 115 may be formed between the SiC substrate 114 and the III-Nitride layer to prevent cracks in the III-Nitride layer 116. In embodiments, the III-Nitride layer 116 may include only GaN buffer layer 116-22. In alternative embodiments, the III-Nitride 116 layer may include the GaN buffer layer 116-14 and the AlGaN/InAlN layers 116-12.

At step 2204, the protection layer 118 may be disposed on the III-Nitride layer 116, where the protection layer may be formed of a material that includes one or more of SiN, poly silicon, $Al_2O_3$, AlN and GaN.

At step 2206, the carrier wafer 110 having the SiC substrate 110, protection layer 112 and chemical etching layer 113 may be bonded to the protection layer 118. In embodiments, the SiC substrate 100 may include thru-holes 104 and channels 106. In embodiments, the glass coating layers 122 and 126 may be formed on the chemical etching layer 113 and protection layer 118, respectively, and heated at the temperature of 900-1000° C. Then, at step 2208, the SiC substrate 114 and nucleation layer 115 may be removed.

It is noted that a portion of the III-Nitride layer 116 may be also removed at step 2208. In embodiments, when the III-Nitride layer 116 is formed of a GaN only, a portion of the GaN near the interface between the GaN layer 116-22 and nucleation layer 115 may include cracks developed during deposition of the GaN layer 116-22. Similarly, in alternative embodiments, when the III-Nitride layer 116 includes the GaN buffer layer 116-14 and the AlGaN/InAlN layer 116-12, a portion of the GaN layer near the interface between the GaN layer 116-14 and nucleation layer 115 may include cracks developed during deposition of the GaN layer 116-14 and the AlGaN/InAlN layer 116-12. In both cases, a portion of the GaN layer having the cracks may be removed so that the remaining III-Nitride layer 117 may not include any crack, at step 2208.

At step 2210, the diamond layer 140 may be disposed on the III-Nitride layer 117. In embodiments, to mitigate the stress due to the mismatch of CTEs of the diamond layer 140 and the III-Nitride layer 117, the intermediate layer 136 may be formed between the diamond layer 140 and the III-Nitride layer 117. In embodiments, the intermediate layer 136 may include first and second layers, where the first layer may mitigate the stress due to the mismatch of CTEs of the diamond layer 140 and the III-Nitride layer 117. In embodiments, the first layer may be formed of a dielectric material, such as poly-Si, $SiO_2$, $Al_2O_3$ or SiN. In embodiments, the second layer (which is also referred to as seed layer) may be disposed between the first layer and the diamond layer 140, where the seed layer may include diamond nano particle (diamond seed particles). In embodiments, after the step 2210 is completed, a lapping process may be carried out to enhance the surface flatness of the diamond layer 140.

At step 2212, the support wafer 152 may be deposited on the diamond layer 144, where the support wafer 152 may be one of the support wafers 152-1 and 152-2. In embodiments, the support wafer 152-2 may be formed of poly-GaN. In alternative embodiments, the support wafer 152-1 may include the poly-silicon layer 152-12 and the protection layer 152-14 that is deposited on the poly-silicon layer 152-12 and covers the bottom and side surfaces of the poly-silicon layer 152-12. In embodiments, the protection layer 152-14 may be formed of a material that includes one or more of Ti/Au, Cr/Au, SiN, $Al_2O_3$, and AlN.

At step 2214, the carrier wafer 110 and the protection layer 118 may be removed from the wafer 150. At step 2216, another III-Nitride layer (or equivalently, another semiconductor layer having a III-Nitride compound) 162 may be optionally disposed on the III-Nitride layer 117. In embodiments, the III-Nitride layer 117 includes only the GaN buffer layer 116-22, and an additional AlGaN/InAlN layer 162 may be formed on the GaN buffer layer.

Figure 23:
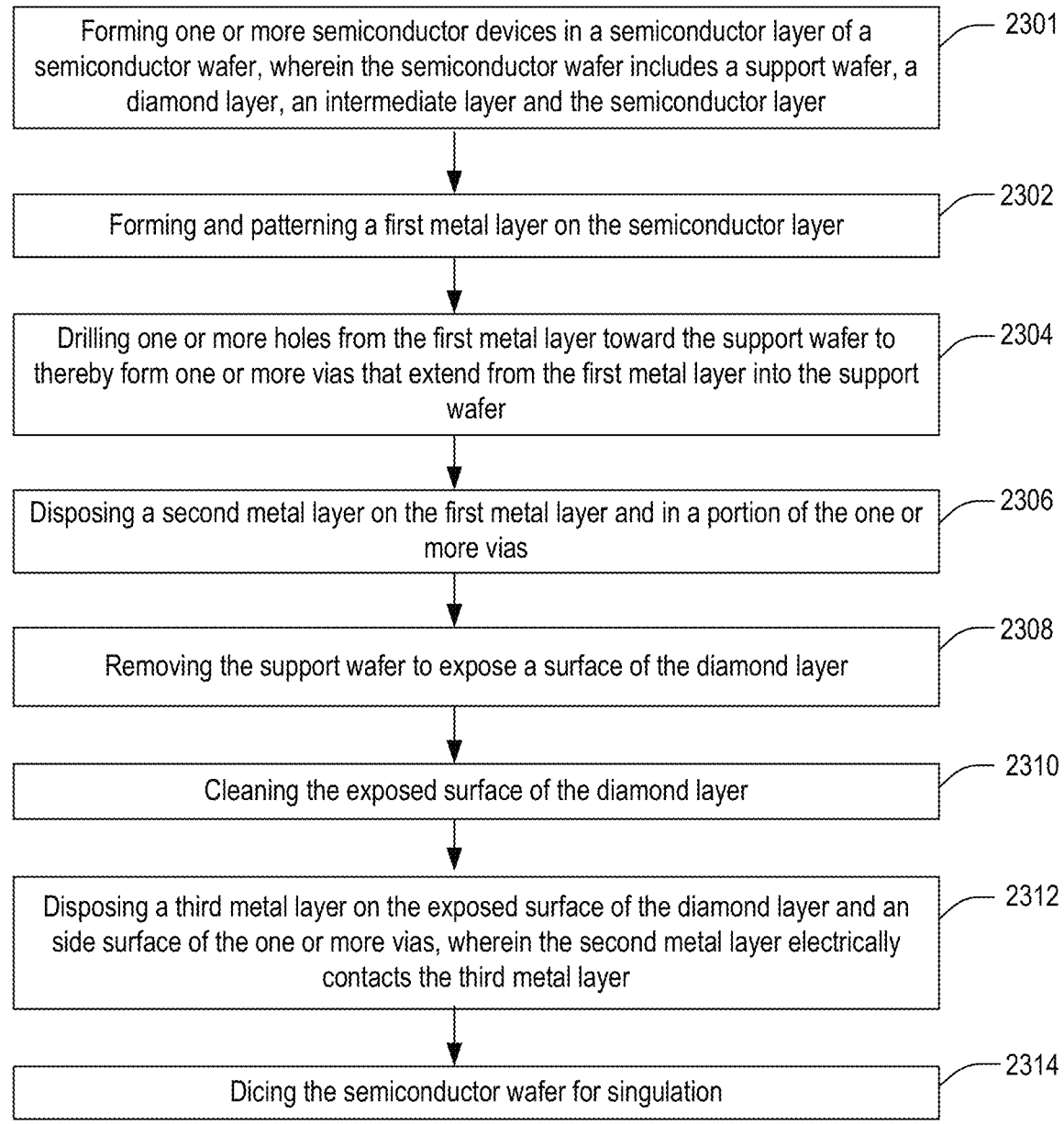
FIG. 23 shows a flowchart of an exemplary process for processing semiconductor devices according to embodiments of the present disclosure.

FIG. 23 shows a flowchart 2300 of an exemplary process for processing a semiconductor wafer according to embodiments of the present disclosure. At step 2301, semiconductor devices 171, such as semiconductor transistors, may be formed in the III-Nitride layer (or equivalently semiconductor layer) 164 of the semiconductor wafer 160. As discussed above, the semiconductor wafer 160 may include the support wafer 152, diamond layer 144, intermediate layer 136 and the III-Nitride layer 164. In embodiments, the support wafer 152 may be the wafer 152-1 that includes the protection layer 152-14 and poly-silicon layer 152-12. In embodiments, the support wafer 152 may be the wafer 152-2 that includes the poly-GaN layer 152-22. At step 2302, the metal layer 172 may be formed and patterned on the III-Nitride layer 164.

At step 2304, a laser drilling technique or any other suitable technique may be performed to drill one or more holes from the metal layer 172 toward the support wafer 152 to thereby form the one or more vias 176, where the one or more vias 176 may extend from the metal layer 172 into the support wafer 152. Then, at step 2306, the metal layer 180 may be formed on the metal layer 172 and in a top portion of the one or more vias 176. Next, at step 2308, the support wafer 152 may be removed to expose the bottom surface of the diamond layer 144. Optionally, in embodiments, the bottom surface of the diamond layer 144 may be further cleaned by a dry etching technique so as to remove the remaining poly-silicon or poly-GaN material on the bottom surface of the diamond layer 144, at step 2310.

At step 2312, the metal layer 202 may be disposed on the exposed surface of the diamond layer 144 and the side surfaces of the one or more vias 176 by the Au plating technique. It is noted that other suitable metal may be used in place of the gold for the metal layer 202, and other suitable techniques may be used to form the metal layer 202 on the diamond surface 144. In embodiments, the metal layer 202 may be in electrical contact with the metal layers 172 and 180 through the vias 176. Then, at step 2314, the wafer 200 may be diced for singulation.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A method for fabricating a semiconductor wafer, comprising:
    disposing a nucleation layer on a first substrate;
    disposing at least one semiconductor layer on the nucleation layer, the at least one semiconductor layer including a III-Nitride compound;
    disposing a protection layer on the at least one semiconductor layer;
    bonding a carrier wafer to the protection layer, the carrier wafer including an SiC substrate;
    removing the first substrate, the nucleation layer and a portion of the at least one semiconductor layer;
    disposing a diamond layer on the at least one semiconductor layer;
    depositing a support wafer on the diamond layer; and
    removing the carrier wafer and the protection layer.

2. The method of claim 1, wherein the at least one semiconductor layer includes a GaN layer that is directly disposed on the nucleation layer and wherein the removed portion of the at least one semiconductor layer is a portion of the GaN layer near an interface between the nucleation layer and the GaN layer.

3. The method of claim 2, wherein the step of disposing at least one semiconductor layer includes:
    disposing the GaN layer on the nucleation layer; and
    disposing at least one of AlGaN layer and an InAlN layer on the GaN layer.

4. The method of claim 1, further comprising, after the step of removing the carrier wafer and the protection layer:
    disposing an additional semiconductor layer on the at least one semiconductor layer, the additional semiconductor layer including a III-Nitride compound.

5. The method of claim 1, wherein the protection layer is formed of a material that includes one or more of SiN, poly-Si, $Al_2O_3$, AlN and GaN.

6. The method of claim 1, wherein the step of disposing a diamond layer on the at least one semiconductor layer includes:
    disposing an intermediate layer on the at least one semiconductor layer, the intermediate layer including a first layer that is formed of a material including one or more of poly-Si, $SiO_2$, $Al_2O_3$, and SiN and a second layer including diamond particles; and
    disposing the diamond layer on the intermediate layer.

7. The method of claim 1, further comprising, after the step of disposing a diamond layer:
    lapping a surface of the diamond layer to enhance a flatness of the surface of the diamond layer.

8. The method of claim 1, wherein the support wafer further includes a poly-silicon layer covered by a protection layer that is formed of a material including one or more of Ti/Au, Cr/Au, SiN, $Al_2O_3$, and AlN.

9. The method of claim 1, wherein the support wafer includes a poly-GaN layer.

10. The method of claim 1, further comprising:
    forming one or more semiconductor devices in the at least one semiconductor layer.

11. The method of claim 1, wherein the first substrate is formed of SiC.

12. The method of claim 1, further comprising, prior to the step of bonding a carrier wafer to the protection layer:
    forming one or more thru-holes in the SiC substrate of the carrier wafer; and
    forming one or more patterns on a surface of the SiC substrate,
    wherein the one or more thru-holes are in fluid communication with the one or more patterns, and the step of removing the carrier wafer and the protection layer includes introducing etching solution into the thru-holes.

13. The method of claim 1, further comprising, prior to the step of bonding a carrier wafer to the protection layer:
    forming a protection layer and a chemical etching layer on the SiC substrate of the carrier wafer,
    wherein the step of removing the carrier wafer and the protection layer includes etching the chemical etching layer.

14. The method of claim 1, wherein the step of bonding a carrier wafer to the protection layer includes glass bonding the carrier wafer to the protection layer.

15. The method of claim 1, wherein the one or more semiconductor devices include one or more high electron mobile transistors (HEMTs).

* * * * *